United States Patent
Ji et al.

(10) Patent No.: US 10,985,040 B2
(45) Date of Patent: Apr. 20, 2021

(54) SUBSTRATE TREATMENT METHOD AND SUBSTRATE TREATMENT APPARATUS

(71) Applicant: AP SYSTEMS INC., Hwaseong-Si (KR)

(72) Inventors: Sang Hyun Ji, Yongin-Si (KR); Yong Soo Moon, Incheon (KR); Gun Bum Lee, Osan-Si (KR)

(73) Assignee: AP SYSTEMS INC.

(*) Notice: Subject to any disclaimer, the term of this patent is extended or adjusted under 35 U.S.C. 154(b) by 253 days.

(21) Appl. No.: 16/132,218

(22) Filed: Sep. 14, 2018

(65) Prior Publication Data

US 2019/0103296 A1    Apr. 4, 2019

(30) Foreign Application Priority Data

Sep. 29, 2017 (KR) .................. 10-2017-0127913

(51) Int. Cl.
*G01J 5/00* (2006.01)
*G01K 1/00* (2006.01)
(Continued)

(52) U.S. Cl.
CPC ...... *H01L 21/67248* (2013.01); *G01J 5/0007* (2013.01); *G01J 5/0096* (2013.01);
(Continued)

(58) Field of Classification Search
USPC .................. 374/126, 121, 141, 1, 208, 128
See application file for complete search history.

(56) References Cited

U.S. PATENT DOCUMENTS 4,919,542 A * 4/1990 Nulman ................ G01J 5/0003
                                                        250/338.3
5,255,286 A * 10/1993 Moslehi ............... G01J 5/0003
                                                       250/227.11
(Continued)

FOREIGN PATENT DOCUMENTS

JP     2000133600 A    5/2000
KR    20030048394 A    6/2003
KR      101389004 B1   4/2014

*Primary Examiner* — Mirellys Jagan
(74) *Attorney, Agent, or Firm* — Renaissance IP Law Group LLP

(57) ABSTRACT

A substrate treatment method in accordance with an exemplary embodiment includes: heating a substrate, for a substrate treatment process, so that a temperature of the substrate reaches a target temperature; calculating the temperature of the substrate using a sensor located facing the substrate while heating the substrate; and controlling an operation of a heating part configured to heat the substrate according to the temperature calculated from the calculating the temperature, wherein the calculating the temperature comprises: measuring a total radiant energy ($E_t$) radiated from the substrate using the sensor; calculating a corrected total emissivity ($\varepsilon_{ro}$) by applying a correction value for correcting the total emissivity ($\varepsilon_t$) which is the emissivity of the radiant energy ($E_t$); and calculating the temperature ($T_s$) of the substrate using the total radiant energy ($E_t$) and the corrected total emissivity ($\varepsilon_{ro}$).

13 Claims, 5 Drawing Sheets

(51) Int. Cl.
*G01K 13/00* (2021.01)
*H01L 21/67* (2006.01)
*G01J 5/02* (2006.01)
*G01J 5/08* (2006.01)

(52) U.S. Cl.
CPC ............... *G01J 5/027* (2013.01); *G01J 5/085* (2013.01); *G01J 5/0809* (2013.01); *H01L 21/67115* (2013.01); *H01L 21/67253* (2013.01); *G01J 2005/0051* (2013.01)

(56) References Cited

U.S. PATENT DOCUMENTS

| | | | | |
|---|---|---|---|---|
| 5,443,315 A | * | 8/1995 | Lee ........................ | G01J 5/522 374/126 |
| 5,601,366 A | * | 2/1997 | Paranjpe ............... | G01J 5/0003 374/124 |
| 5,830,277 A | * | 11/1998 | Johnsgard ............. | C23C 16/481 118/725 |

* cited by examiner

SUBSTRATE TREATMENT METHOD AND SUBSTRATE TREATMENT APPARATUS

CROSS-REFERENCE TO RELATED APPLICATION

This application claims priority to Korean Patent Application No. 10-2017-0127913 filed on Sep. 29, 2017 and all the benefits accruing therefrom under 35 U.S.C. § 119, the contents of which are incorporated by reference in their entirety.

BACKGROUND

The present disclosure relates to a substrate treatment method and a substrate treatment apparatus, and more particularly, to a substrate treatment method and a substrate treatment apparatus which are capable of improving reliability of temperature detection.

Apparatuses for performing various heat treatment processes include furnaces and a rapid thermal process (RTP) apparatuses. Among these, the rapid thermal process apparatus treats a substrate with high-temperature heat in a short time, can thereby achieve target effects, and therefore has a merit in that side effects of causing impurities during heat treatment process can be reduced to minimum.

The rapid thermal process apparatus includes: a chamber having a heat treatment space for a substrate; a substrate support which is positioned inside the chamber and on which a substrate to be treated is supported; a plurality of lamps which are positioned to face the substrate support and provide a heat source for heat treating the substrate; a window which is positioned between the plurality of lamps and the substrate support and transmits thermal energy generated from the plurality of lamps so that the thermal energy is transferred to the substrate; a base positioned under the substrate support and having, on the upper portion thereof, a reflective member that reflects light; and a temperature detection unit mounted on the base and provided with a pyrometer that detects the temperature of the substrate. The temperature detection unit includes a temperature control unit which calculates a temperature using data measured from the pyrometer.

The pyrometer detects or measures radiant light radiated from the substrate s, reflected light provided such that the radiant light radiated from the substrate s is reflected by a reflective member at least once, and reflected light which is emitted to the substrate s from a light source and is reflected by the substrate s. In addition, the temperature control unit uses the amounts of radiant light and reflected light, which are measured by the pyrometer, to convert the amounts into the radiant intensity and emissivity of light, and calculates a temperature using these.

Here, the temperature control unit calculates the temperature of the substrate by applying the radiant energy and emissivity to an equation expressing Planck's law about black body radiation. In addition, according to the calculated temperature of the substrate, whether to operate or the power of each of the plurality of lamps are adjusted to adjust the substrate to a target temperature.

Meanwhile, referring to FIG. 2, the moving path of the reflective light incident on the pyrometer includes a case (A) in which among the reflected light, light emitted from the pyrometer is reflected from the substrate and is directly incident on the pyrometer, and a case (B and C) in which radiant light radiated from the substrate is reflected from the reflective member at least once and is then incident on the pyrometer. Thus, in calculating the temperature by applying the emissivity in the temperature control unit, the total emissivity $\varepsilon_t$ including the emissivity (hereinafter substrate emissivity) when light emitted from the pyrometer is reflected from the substrate and is directly incident on the pyrometer, and the emissivity enhanced when the radiant light emitted from the substrate is reflected from the reflective member at least once and is then incident on the pyrometer. The total emissivity $\varepsilon_t$ varies according to the substrate emissivity.

When a substrate at room temperature is heated, the phenomenon in which the substrate is deflected downward occurs, and at this point, according to the degree of deflection of the substrate, the substrate emissivity value calculated from the temperature detection unit varies. That is, there is a tendency that the closer to the pyrometer the defection degree of the substrate, the lower the substrate emissivity. In particular, in the process of raising the temperature of a substrate at room temperature to the process temperature, the degree of variation in the substrate emissivity is great, and at this point, it is sometimes detected that the substrate emissivity $\varepsilon_s$ instantaneously drops to "0", and when the substrate emissivity $\varepsilon_s$ is "0", according to the equation for calculating the total emissivity $\varepsilon_t$, the total emissivity $\varepsilon_t$ becomes "0". However, practically, there can be no object having the emissivity of "0". Thus, when the total emissivity $\varepsilon_t$ In addition, as described above, according to the decrease in the substrate emissivity $\varepsilon_s$, the total emissivity ET decreases. According to the conventional calculation equation, in the interval in which the substrate emissivity $\varepsilon_s$ is no greater than approximately 0.5, more specifically, no greater than approximately 0.3, the degree of variation in the total emissivity ET according to the variation in the substrate emissivity $\varepsilon_s$ is great. Describing this in other words, in the interval in which the substrate emissivity $\varepsilon_s$ is no greater than approximately 0.5, more specifically, no greater than approximately 0.3, the sensitivity of the total emissivity ET is great.

This becomes a cause for increasing the temperature deviation between the calculated temperature and the actually measured value of temperature of the substrate when the substrate emissivity $\varepsilon_s$ is calculated to fall within a low temperature range (no greater than approximately 0.5, more specifically, no greater than approximately 0.3).

Thus, since the error of the calculated temperature is great, upon controlling the plurality of lamps according to the temperature calculated from the temperature control unit, the temperature of the substrate is not easily controlled to a target temperature, and this causes degradation in product quality and causes a problem of unstable process. In particular, while raising the temperature of the substrate at room temperature to the process temperature, it is difficult to control the temperature of the substrate, and process stability cannot be secured.

SUMMARY

The present disclosure provides a substrate treatment method and a substrate treatment apparatus capable of reducing the deviation from an actually measured temperature.

The present disclosure provides a substrate treatment method and a substrate treatment apparatus which are capable of securing process stability.

In accordance with an exemplary embodiment, a substrate treatment method includes: heating a substrate, for a substrate treatment process, so that a temperature of the substrate reaches a target temperature; calculating the temperature of the substrate using a sensor located facing the substrate while heating the substrate; and controlling an operation of a heating part configured to heat the substrate according to the temperature calculated from the calculating the temperature, wherein the calculating the temperature comprises: measuring a total radiant energy ($E_t$) radiated from the substrate using the sensor; calculating a corrected total emissivity ($\varepsilon_{t0}$) by applying a correction value for correcting the total emissivity ($\varepsilon_t$) which is the emissivity of the radiant energy ($E_t$); and calculating the temperature ($T_s$) of the substrate using the total radiant energy ($E_t$) and the corrected total emissivity ($\varepsilon_{t0}$).

The temperature may be calculated by using Equation 1 in calculating the temperature $T_s$ of the substrate using the total radiant energy ($E_t$) and the corrected total emissivity ($\varepsilon_{t0}$).

$$T_s = \frac{C_2}{\lambda \cdot \ln\left\{\frac{\varepsilon_{t0} \, C_1}{\lambda^5 E_t}\right\}} \quad \text{[Equation 1]}$$

In Equation 1, $\lambda$ is a wavelength of light radiated from the sensor for the light,
$C_1$ is approximately $3.7419 \times 10^{-16}$,
and $C_2$ is a constant of approximately 14.387.

A reflective member may be installed at a position facing the substrate; the sensor may be installed to pass through the reflective member in a vertical direction; a free space defined by the substrate and the reflective member may be called a cavity; the corrected total emissivity ($\varepsilon_t$) may be calculated by using the emissivity ($\varepsilon_s$) and the cavity factor (CF); and the cavity factor (CF) may include reflectivity ($\rho_r$) of the reflective member and a ratio (H/W) of a separation distance (H) between the substrate and the sensor with respect to a width (W) of a separation space between the substrate and the reflective member.

The corrected total emissivity ($\varepsilon_{t0}$) may be calculated by using Equation 7 including the correction value ($\varepsilon_0$), the emissivity ($\varepsilon_s$) of the substrate, and the cavity factor (CF).

$$\varepsilon_{t0} = \frac{\varepsilon_s + \varepsilon_0}{1 - CF(1 - \varepsilon_s - \varepsilon_0)} \times \frac{1 + CF\varepsilon_0}{1 + \varepsilon_0} \quad \text{[Equation 7]}$$

The substrate treatment method may include deriving and setting, in advance, the correction value ($\varepsilon_0$) and the cavity factor (CF) before the substrate treatment process, wherein in the calculating the temperature for the substrate treatment process, the derived correction value ($\varepsilon_0$) and the cavity factor (CF) may be applied to above Equation 7 to calculate the temperature ($T_s$) of the substrate.

The substrate treatment method may include comparing the derived cavity factor (CF) with a reference value after the deriving the correction value ($\varepsilon_0$) and the cavity factor (CF); and replacing or repairing the reflective member when the cavity factor (CF) is less than the reference value.

The deriving the correction value ($\varepsilon_0$) and the cavity factor (CF) may include: preparing and heating a substrate for deriving the correction value ($\varepsilon_0$) and the cavity factor (CF); and calculating the correction value ($\varepsilon_0$) and the cavity factor (CF) using Equation 9 configured to make a corrected calculated temperature (Td) which is a temperature calculated through Equation 8 using total radiant energy ($E_t$) measured from the heated substrate becomes an actual temperature ($T_{real}$) of the substrate.

$$T_{real} = T_c - 273.15 \quad \text{[Equation 8]}$$

$$T_{real} = \frac{C_2}{\lambda \cdot \ln\left\{\frac{\varepsilon_{t0} C_1}{\lambda^5 E_t}\right\}} - 273.15 = \frac{1}{\frac{\lambda}{C_2} \ln \varepsilon_{t0} + \frac{\lambda}{C_2} \ln\left(\frac{C_1}{\lambda^5 E_t}\right)} - 273.15 \quad \text{[Equation 9]}$$

The deriving the correction value ($\varepsilon_0$) and the cavity factor (CF) may include: heating a plurality of substrates having emissivities different from each other and measuring the actual temperature of each substrate; preparing an equation configured to set the cavity factor (CF) and the correction value ($\varepsilon_0$) in Equation 9 as unknowns for each of the plurality of substrates; and associatively calculating the equation for each of the plurality of substrates and deriving the correction value ($\varepsilon_0$) and the cavity factor (CF).

In accordance with another exemplary embodiment, a substrate processing apparatus includes: a substrate support part configured to support a substrate on an upper portion thereof; a base located to face the substrate support part under the substrate support part and provided with a reflective member installed on a surface thereof facing the substrate support part; a heating part located over the substrate support part to face the substrate support part and configured to heat the substrate; a sensor inserted and installed in the base to face the substrate mounted in the base, and configured to measure a total radiant energy ($E_t$) and reflectivity ($\rho_s$) which are radiated from the substrate; and a temperature control unit configured to measure a temperature of the substrate using the total radiant energy ($E_t$) and reflectivity ($\rho_s$) which are measured from the sensor and control an operation of the heating part according to the calculated temperature, wherein the temperature control unit calculates the temperature ($T_s$) of the substrate using a total emissivity ($\varepsilon_{t0}$) calculated by applying a correction value ($\varepsilon_0$) to a total emissivity ($\varepsilon_t$) which is the emissivity of the total radiant energy ($E_t$) and the total radiant energy ($E_t$). The temperature control unit may calculate the temperature ($T_s$) of the substrate using Equation 1 including the total radiant energy ($E_t$) and the corrected total emissivity ($\varepsilon_{t0}$).

$$T_s = \frac{C_2}{\lambda \cdot \ln\left\{\frac{\varepsilon_{t0} \, C_1}{\lambda^5 E_t}\right\}} \quad \text{[Equation 1]}$$

In Equation 1, $\lambda$ is a wavelength of light radiated from the sensor for the light,
$C_1$ is approximately $3.7419 \times 10^{-16}$,
and $C_2$ is a constant of approximately 14.387.

The temperature control unit may calculate the corrected total emissivity ($\varepsilon_{t0}$) using the emissivity ($\varepsilon_s$) of the substrate and the cavity factor (CF), and the cavity factor (CF) may include a reflectivity ($\rho_r$) of the reflective member and a ratio (H/W) of a separation distance (H) with respect to a width (W) of a cavity which is a separation space between the substrate and the reflective member.

The temperature control unit may calculate the corrected total emissivity ($\varepsilon_{t0}$) using Equation 7 including the correction value ($\varepsilon_0$), the emissivity ($\varepsilon_s$) of the substrate, and the cavity factor (CF).

$$\varepsilon_{t0} = \frac{\varepsilon_s + \varepsilon_0}{1 - CF(1 - \varepsilon_s - \varepsilon_0)} \times \frac{1 + CF\varepsilon_0}{1 + \varepsilon_0} \quad \text{[Equation 7]}$$

The substrate processing apparatus may include a correction unit configured to derive the correction value ($\varepsilon_0$) and the cavity factor (CF) for optimization of the correction value ($\varepsilon_0$) and the cavity factor (CF) before and after a substrate treatment process.

The substrate processing apparatus may include a monitoring unit configured to compare the cavity factor derived from the correction unit and determine and display whether to replace or repair the reflective member according to a comparison result.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
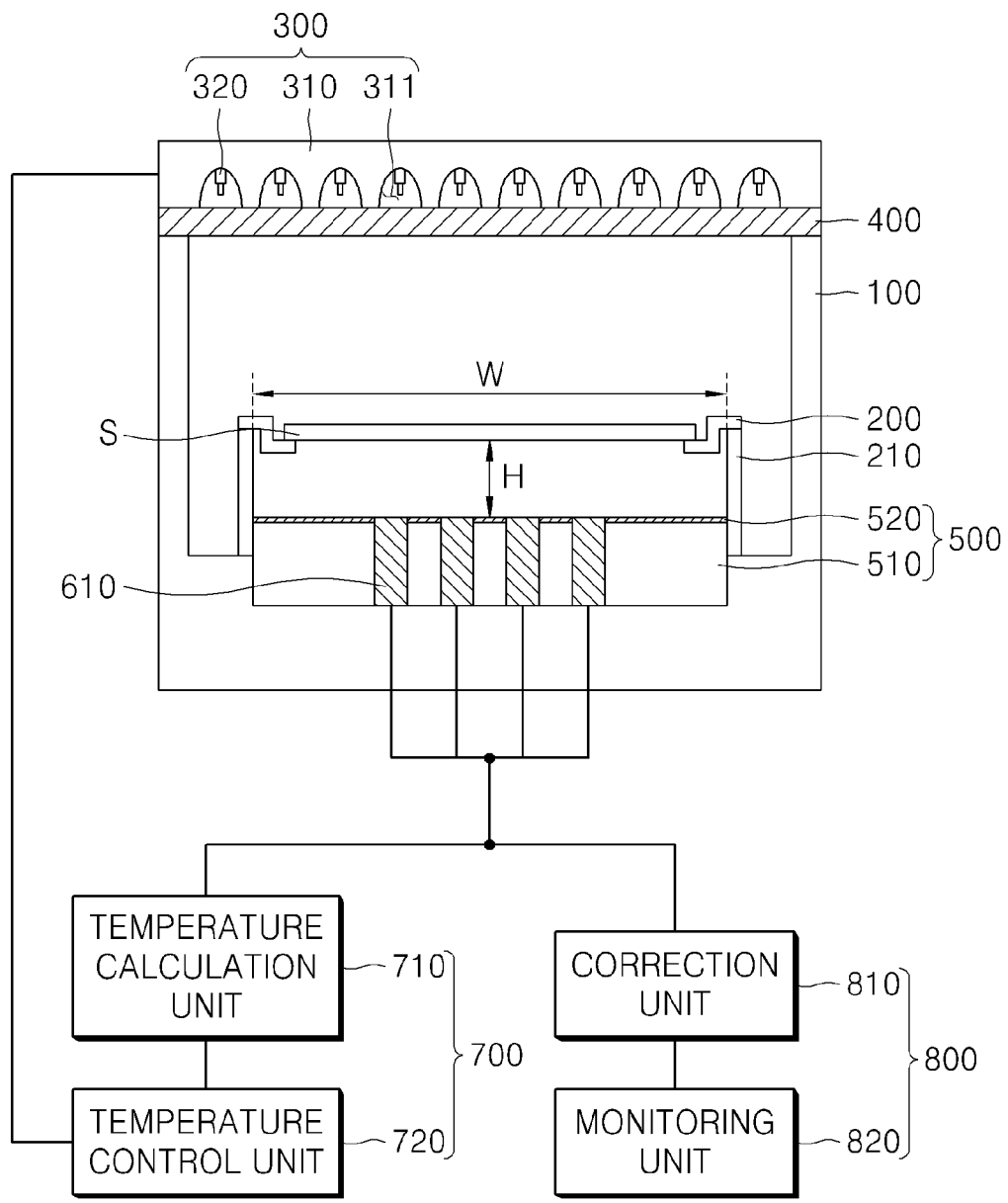
FIG. 1 is a cross-sectional view of a substrate treatment apparatus in accordance with an exemplary embodiment.

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the drawings, like reference numerals refer to like elements throughout.

Figure 2:
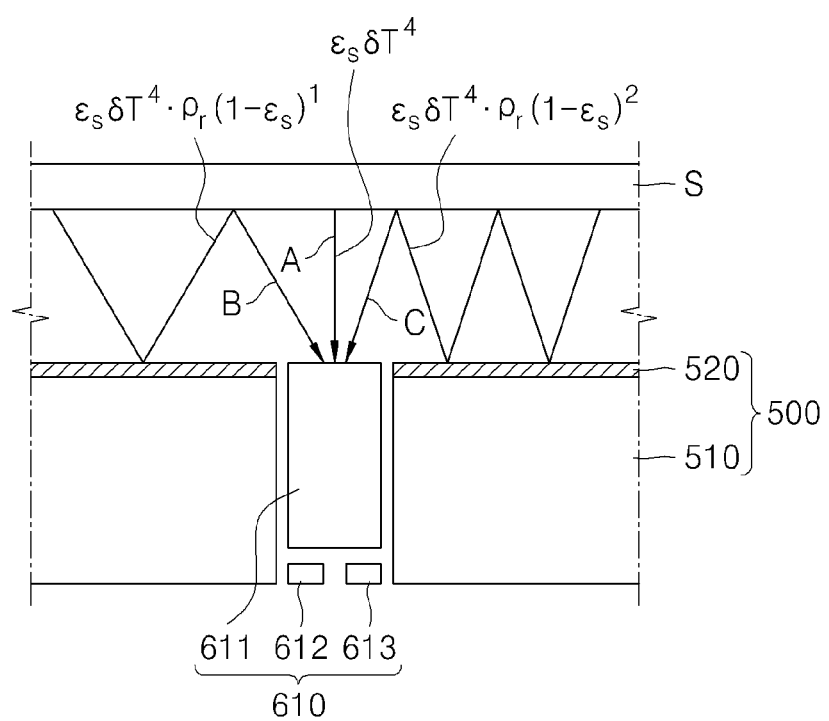
FIG. 2 is a schematic view for describing various paths through which radiant light (or radiant ray) is incident on a sensor in a substrate treatment apparatus in accordance with an exemplary embodiment.
Figure 3:
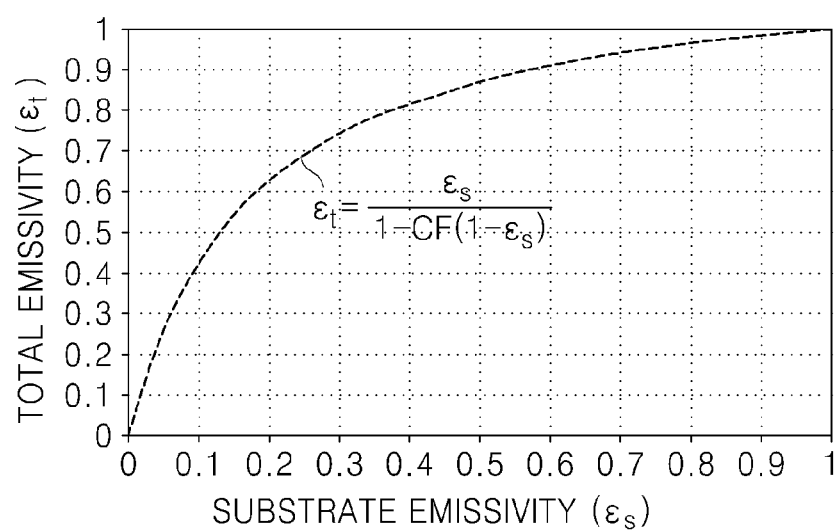
FIG. 3 is a graph showing the total emissivity $\varepsilon_t$ versus the substrate emissivity $\varepsilon_s$ according to a total emissivity calculation model.
Figure 4:
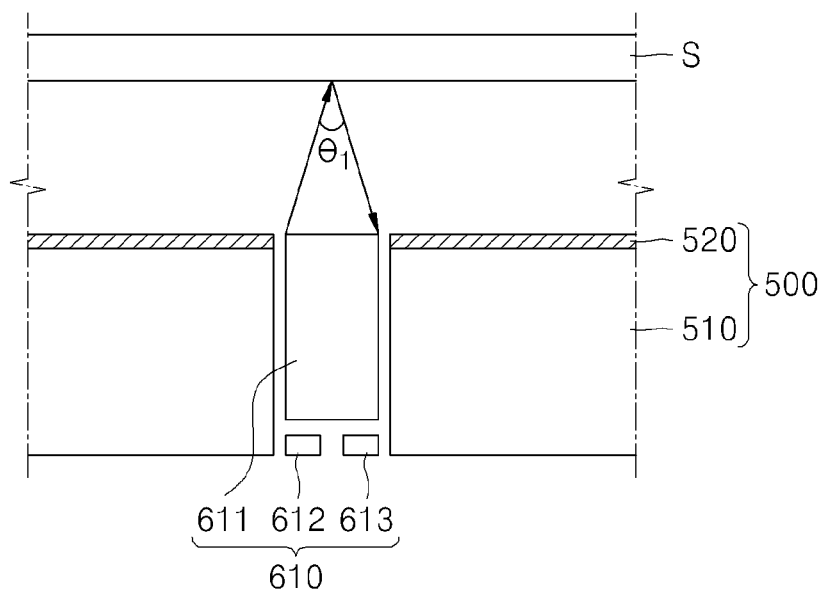
FIG. 4 is a schematic view illustrating an angle θ1 at which the light radiated from a sensor is reflected from a substrate and is incident again on the sensor when the substrate is in a state of being parallel to the ground surface or not being bent.
Figure 5:
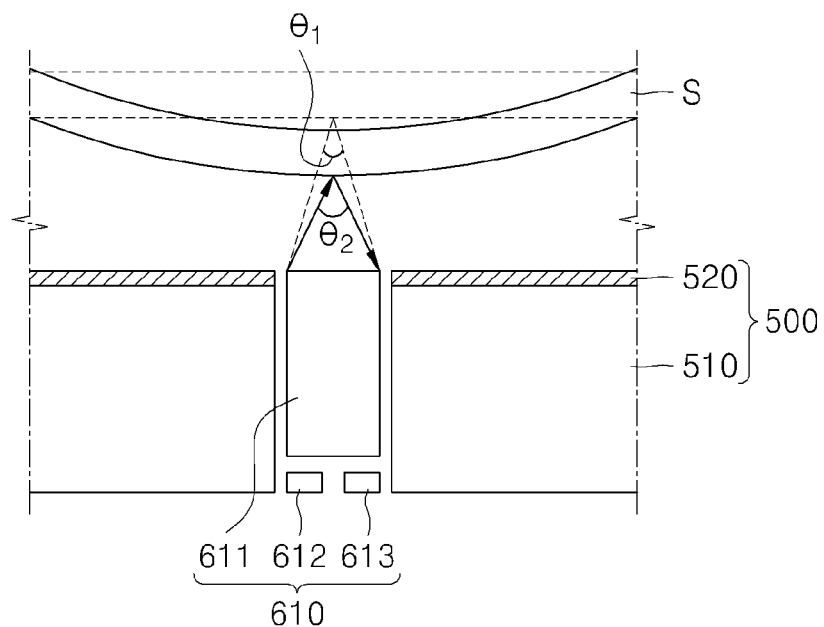
FIG. 5 is a schematic view illustrating an angle θ2 at which the light radiated from a sensor is reflected from a substrate and is incident again on the sensor when the substrate is in a state of not being parallel to the ground surface or being bent.
Figure 6:
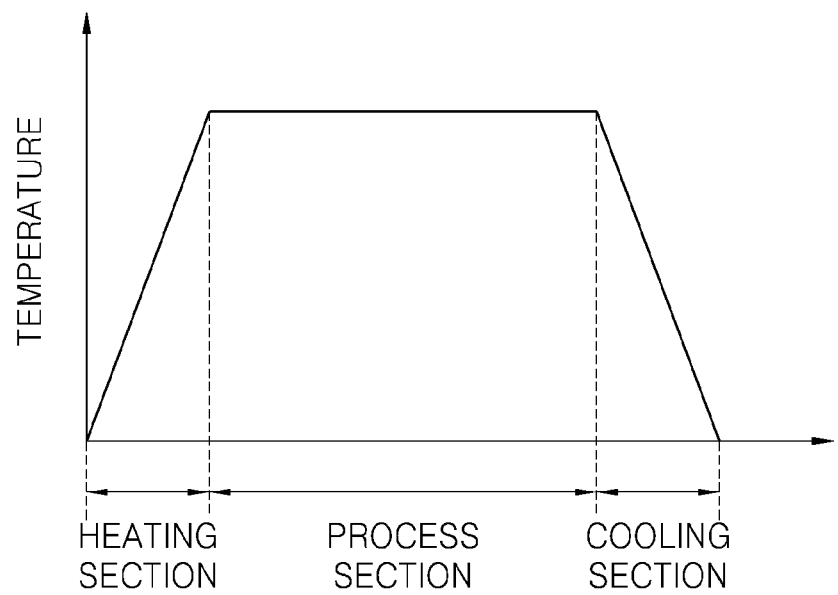
FIG. 6 is a view schematically illustrating temperature variation during a substrate treatment process.
Figure 7:
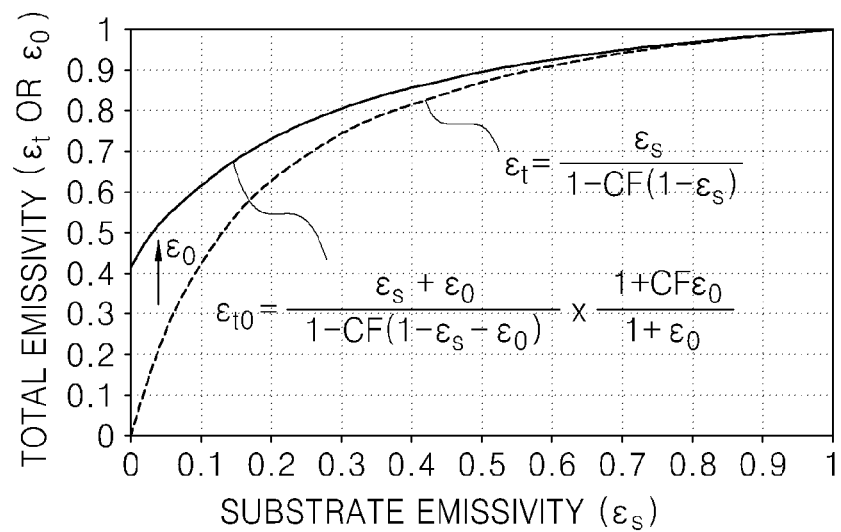
FIG. 7 is a graph showing a total emissivity $\varepsilon_{t0}$ according to a substrate emissivity $\varepsilon_s$ corrected by a method in accordance with an exemplary embodiment.

FIG. 1 is a cross-sectional view of a substrate treatment apparatus in accordance with an exemplary embodiment. FIG. 2 is a schematic view for describing various paths through which radiant light (or radiant ray) is incident on a sensor in a substrate treatment apparatus in accordance with an exemplary embodiment. FIG. 3 is a graph showing the total emissivity $\varepsilon_t$ versus the substrate emissivity $\varepsilon_s$ according to a total emissivity calculation model. FIG. 4 is a schematic view illustrating an angle θ1 at which the light radiated from a sensor is reflected from a substrate and is incident again on the sensor when the substrate is in a state of being parallel to the ground surface or not being bent. FIG. 5 is a schematic view illustrating an angle θ2 at which the light radiated from a sensor is reflected from a substrate and is incident again on the sensor when the substrate is in a state of being not parallel to the ground surface or being bent. FIG. 6 is a view schematically illustrating temperature variation during a substrate treatment process. FIG. 7 is a total emissivity variation graph, and the total emissivity $\varepsilon_{t0}$ corrected by using a method in accordance with exemplary embodiment and the total emissivity $\varepsilon_t$ in accordance with a comparative example were shown.

A substrate treatment apparatus in accordance with an exemplary embodiment is an apparatus for performing heat treatment on a substrate. More specifically, the substrate treatment apparatus in accordance with an exemplary embodiment is a, so called, rapid thermal process (RTP) apparatus which generates a high-temperature heat and rapidly performs heat treatment on a substrate by using the heat.

Referring to FIG. 1, a substrate treatment apparatus in accordance with an exemplary embodiment includes: a chamber 100 having a heat treatment space; a substrate support part 200 installed inside the chamber to support a substrate s to be treated; a heating part 300 positioned to face the substrate support part 200 and providing a heat source for heat treatment of the substrate s; a window 400 positioned between the heating part 300 and the substrate support part 200 and allowing the thermal energy generated from the plurality of lamps 320 to be transmit the window and transferred to the substrate s; a base 500 provided to extend in a direction corresponding to an extension direction of the substrate s under the substrate support part 200; a temperature control unit 700 which is provided with sensors 610 each inserted into the substrate support part 200 so as to face the substrate s supported by the substrate support part 200 to measure radiant energy and reflectivity for calculating the temperature of the substrate s, and which calculates the temperature of the substrate s by using the radiant energy and reflectivity measured by the sensors 610 and controls the operation of the heating part 300 according to the calculated temperature; and a coercion unit 800 which corrects the temperature control unit 700 before or after a substrate treatment process so that a deviation between the temperature of the substrate s calculated by the temperature control unit 700 and the actual temperature of the substrate s becomes small.

In addition, the substrate treatment apparatus includes a support frame 210 which has one end connected to the substrate support part 200 and the other end extending in the peripheral direction of the substrate support part 200 and the base 500 to thereby support the substrate support part 200 and defines a space between the substrate support part 200 and the base 500.

The substrate s in accordance with an exemplary embodiment may be a wafer used in a semiconductor apparatus. Of course, the substrate s may also be, but not limited to, various objects to be treated that require heat treatment, such as glass applied to a display device such as LCD and OLED.

The chamber 100 assumes a cylindrical shape having an inner space in which the substrate s to be treated is heat-treated, for example, a rectangular cylinder shape having a rectangular horizontal cross section. More specifically, the chamber 100 according to an exemplary embodiment assumes a shape having an upper side which is opened or has an opening, and is sealed by the window 400 and the heating part 300 to be described later. In addition, in the chamber 100, an entrance for input and output of the substrate s may be installed and a robot for delivering the substrate s may be installed.

In the above, while it has been described that the shape of the chamber 100 is a rectangular cylinder shape, embodiments are not limited thereto, and may be changed to various shapes having a heat treatment space for the substrate s, such as a circle or a polygon.

The substrate support part 200 is located over the base 500 inside the chamber 100. The substrate support part 200 according to an exemplary embodiment may be configured to support lower periphery or edges of the substrate s. In other words, the substrate support part 200 may be a hollow shape provided with an opening, and the opening exposes remaining regions of the substrate s except for peripheral regions of the substrate s.

Referring to FIGS. 1 and 2, the base 500 includes: a body 510 extending in a direction corresponding to the extension direction of the substrate s under the substrate support part 200; and a reflective member 520 located on the surface facing the substrate support part 200 or the substrate s, for example, the upper surface of the base. The reflective member 520 preferably has reflectivity of no less than approximately 98%. In the reflective member 520 according to an exemplary embodiment, the upper surface of the body 510 is optically coated with a material having a high reflectivity, but methods for manufacturing or forming the reflective member 520 is not limited thereto, and various methods may be used.

The heating part 300 includes: a housing 310 located to face the upper side opening of the chamber 100 and the window 400; and a plurality of lamps 320 installed to be spaced apart from each other so as to be arranged in the extension direction of the housing 310.

The housing 310 is installed on the upper side of the chamber 100 so as to close or seal the upper side opening of the chamber 100 and protects the chamber 100 from external environment. In addition, in this housing 310, the plurality of lamps 320 are installed to be spaced apart from each other, and to this end, in the housing 310, the direction facing the window 400 or the substrate support part 200 is opened, and a plurality of mounting grooves 311 which can accommodate the lamps 320 are provided. That is, in the housing 310, the plurality of mounting grooves 311 are provided so as to be spaced apart from each other, and the mounting grooves 311 assume a shape in which a direction facing the window 400, for example, the lower side, is opened, and the lamps 320 are installed inside the housing. The mounting grooves 311 according to an exemplary embodiment assume, but not limited to, a dome shape with an opened lower side, and may be changed into various shapes in which the lamps 320 can be inserted.

As described above, each of the lamps 320 is a means for providing heat for heat treatment of the substrate s, and is installed in the plurality of mounting grooves 311 provided in the housing 310. Thus, heat generated from the plurality of lamps 320 are transmitted to the substrate s via the window 400.

The lamps in accordance with an exemplary embodiment each include: for example, a lamp body having a filament therein to transmit radiant heat; a lamp support part for fixing the lamp body; and a lamp socket connected to the lamp support part to receive external power. Here, the lamp body may be manufactured by using glass or quartz so that radiant heat can pass through without loss, and inert gases (e.g., halogen and argon) are effectively filled in the lamp body.

The plurality of lamps 320 are disposed to be spaced apart from each other, and the arrangement structure or the installation structure thereof may be variously changed according to the shape, size, or the like of the substrate s.

The sensors 610 receives radiant light radiated from the substrate and light emitted from the sensors to the substrate and reflected again from the substrate, and measures the energy (hereinafter radiant energy) and the reflectivity of the radiant light. The radiant energy and the reflectivity which are measured from the sensors 610 are transmitted to the temperature control unit 700 to be described later, and are used for calculating the temperature of the substrate s in the temperature control unit 700. In addition, the sensors 610 are provided in plurality, are disposed to be arranged in the extension direction of the substrate s, and measure the radiant energy and reflectivity in a region or at a position of the substrate correspondingly disposed.

The sensors 610 in accordance with an exemplary embodiment are pyrometers, and include: a rod 611 inserted into the base 500; a light source 612 located under the rod 611 to radiate or emit light; and a photo detector part 613 which is disposed under the rod 611 so as to be spaced apart in the width direction of the rod 611, and detects radiant light and reflected light which are incident on or received by the rod 611.

As described above, the photo detector part 613 detects the energy (radiant energy) of the radiant light radiated from the substrate and an amount of reflected light which is emitted from the light sources of the sensor 610 to the substrate and is reflected from the substrate, and thereby measures the reflectivity of the substrate. Here, the radiant energy is the amount of radiant light radiated from the substrate, in other words, the radiant strength of the radiant light radiated from the substrate s itself. In addition, the reflectivity of the substrate s may be measured by detecting an amount of light which is reflected from the substrate s and is incident again on the photo detector part 613 compared to an amount of light radiated from the light sources 612 of the sensors 610.

The temperature control unit 700 includes: a temperature calculation unit 710 which calculates the temperature of the substrate s using the radiant energy and the reflectivity of the substrate s which are measured from the sensor 610; and a temperature control unit 720 which controls the operations of the plurality of lamps 320 according to the temperature calculated from the temperature calculation unit 710.

The temperature calculation unit 710 receives information about the radiant energy and the reflectivity from each of the plurality of sensors 610 and calculates temperatures for each region or position of the substrate s to which the sensors 610 are correspondingly positioned. In addition, the temperature control unit 720 controls the operation of each of the plurality of lamps 320 according to the temperatures calculated from the temperature calculation unit 710 for each region or position of the substrate s, and may adjust the operation, power, etc. of each of the plurality of lamps 320.

The temperature calculation unit 710 calculates the temperature of the substrate s using the radiant energy and reflectivity of the substrate which are measured from the sensors 610. The temperature calculation unit 710 according to an exemplary embodiment calculates temperatures using a temperature calculation model (hereinafter, equation 1) which uses or is dependent on Planck's law on the emissivity of a black body.

$$T_s = \frac{C_2}{\lambda \cdot \ln\left(\frac{\varepsilon_{t0} \, C_1}{\lambda^5 E_t}\right)}$$ [Equation 1]

In equation 1, $T_s$ is the temperature of the substrate s calculated by Equation 1, $\lambda$ is the wavelength of light radiated from the light source of the sensor 610, and $\lambda$ is approximately 0.8-1.0 μm according to the exemplary embodiment. $C_1$ is a constant of approximately $3.7419*10^{-16}$, $C_2$ is a constant of approximately 14.387, $\varepsilon_t$ is the total radiant energy of the substrate, $\varepsilon_0$ is the total emissivity (hereinafter, corrected total emissivity) in which the total emissivity is corrected with respect to the total radiant energy of the substrate.

First, the total radiant energy Et of the substrate s will be described.

The energy of the radiant light, that is, the radiant energy E may be obtained through Stefan-Boltzmann law expressed by Equation 2 below.

$$E = \varepsilon \sigma T^4$$ [Equation 2]

In Equation 2, E is the radiant energy, $\varepsilon$ is the emissivity, $\sigma$ is the Stefan-Boltzmann constant, and T is the absolute temperature of the object to be measured.

Meanwhile, as described in FIG. 2, incident paths of the radiant rays incident on the sensors 610, include a case in which a radiant ray is reflected from the substrate s and is directly incident on the substrate (A), and cases (B and C) in which radiant rays are incident after experiencing a plurality of reflections between two surfaces of the substrate s and the reflective member 520. Accordingly, the total radiant energy Et includes: a direct radiant energy ($\varepsilon_s \rho T^4$) which is the energy of the radiant ray A radiated from the substrate s and is directly incident on the sensors; and the energy ($\varepsilon_s \rho T^4 \cdot \rho r(1-\varepsilon s)^1$, $\varepsilon_s \rho T^4 \cdot \rho r(1-\varepsilon s)^2$ ..., $\varepsilon_s \rho T^4 \cdot \rho r(1-\varepsilon)^n$) of the radiant rays B and C incident on the sensors after experiencing a plurality of reflections between the two surfaces of the substrate s and the reflective member 520.

In addition, the total radiant energy Et can be measured by detecting or sensing, from the sensors, the amount of light of the direct radiant ray A and the amount of radiant rays B and C incident on the substrate after experiencing a plurality of reflections between the two surfaces of the substrate s and the reflective member 520.

Here, the energy of the radiant rays B and C incident on the substrate after experiencing a plurality of reflections between the two surfaces of the substrate s and the reflective member 520 may be named as an amplified radiant energy due to the reflective member 520. That is, when the reflective member 520 is not provided, the total radiant energy Et only includes the energy of the radiant ray A radiated from the substrate s and directly incident on the substrate s. However, since the reflective member 520 is installed, the energy of the radiant rays B and C reflected at least once between the reflective member 520 and the substrate s is added and amplified.

Accordingly, upon calculating the temperature of the substrate s by reflecting the radiant energy from the substrate s, the energy of the radiant ray A directly incident on the sensors 610 without reflection after radiated from the substrate s and the energy of the radiant rays B and C incident on the sensors 610 after being reflected at least once by at least one among the reflective member 520 and the substrate s should all be reflected. The radiant energy including all these was named as the total radiant energy Et and the total radiant energy Et was reflected in Equation 1.

The total radiant energy Et measured by the sensors 610 may be expressed by Equation 3 below.

$$E_t = \varepsilon_s \sigma T^4 + \varepsilon_s \sigma T^4 \cdot \rho_r^1 (1-\varepsilon_s)^1 +$$
$$\varepsilon_s \sigma T^4 \cdot \rho_r^2 (1-\varepsilon_s)^2 \cdots \rho_r^n (1-\varepsilon_s)^n = \frac{\varepsilon_s \sigma T^4}{1 - \rho_r(1-\varepsilon_s)}$$ [Equation 3]

Here, Et is the total radiant energy, $\sigma$ is the Stefan-Boltzmann constant, T is the absolute temperature of the substrate, $\rho_r$ is the reflectivity of the reflective member. In addition, $\varepsilon_s$ is the emissivity of the energy of the radiant ray A directly incident on the substrate s after radiated from the substrate s, and is the emissivity $\varepsilon_s$ owned by the substrate itself without reflection or amplification, and thus named hereinafter as the emissivity $\varepsilon_s$ of the substrate, and the emissivity of the substrate can be calculated by measuring the reflectivity ρs of the substrate from the sensors.

In Equation 1, the total correction emissivity $\varepsilon_{t0}$ is the emissivity corrected by correcting the emissivity of the total radiant energy Et (hereinafter, total emissivity $\varepsilon_t$) through a correction method according to the exemplary embodiment.

First, the total emissivity $\varepsilon_t$ will be described.

Basically, the emissivity is the ratio of the energy $E(\lambda, T)$ radiated from an object with respect to the radiant energy $E_b(\lambda, T)$ of a black body (see Equation 4 below).

$$\varepsilon = \frac{E(\lambda, T)}{E_b(\lambda, T)}$$ [Equation 4]

The total emissivity $\varepsilon_t$ is the amount of radiation of a target object according to the amount of radiation of a black body, and is the emissivity of the total radiant energy Et.

The total emissivity $\varepsilon_t$ includes: the emissivity $\varepsilon_s$ (that is, emissivity $\varepsilon_s$ of the substrate) of the radiant ray A directly incident on the sensors 610 without reflection after radiant energy is radiated from the substrate s; and the emissivity of the amplified radiant rays B and C incident on the sensors 610 after being reflected at least once by at least one among the base 500 and the substrate s. Expressing this by an equation, the equation is as shown in Equation 5 below.

$$\varepsilon_t = \frac{E_t(\lambda, T)}{E_b(\lambda, T)} = \frac{\varepsilon_s}{1 - \rho_r(1-\varepsilon_s)}$$ [Equation 5]

Here, Eb is the radiant energy of a black body, $\varepsilon_t$ is the total radiant energy of the substrate, $\varepsilon_s$ is the emissivity of the substrate, and $\rho_r$ is the emissivity of the reflective member. The reflectivity $\rho_r$ of the reflective member is a known value when manufacturing the reflective member, $\varepsilon_s$ can be measured by detecting the reflectivity of the light directly incident on the sensors after the light radiated from the sensors is reflected by the substrate s.

Examining Equation 5 which is the equation for calculating the total emissivity $\varepsilon_t$, the factors of the total emissivity $\varepsilon_t$ include the reflectivity $\rho_r$ of the reflective member besides the emissivity $\varepsilon_s$ of the substrate.

Meanwhile, in the space 110 defined by the substrate s, the substrate support part 200, the support frame 210, and the base 500, the total emissivity $\varepsilon_t$ is affected by the ratio H/W of the vertical separation distance H between the substrate s and the sensors 610 to the width W of the space, besides the reflectivity $\rho_r$ of the reflective member. However, the influence or weight of the reflectivity $\rho_r$ of the reflective member is greater than those of the ratio H/W of the vertical separation distance H between the substrate s and the sensors 610 to the width W of the space.

Hereinafter the space 110 defined by the substrate s, the substrate support part 200, the support frame 210, and the base 500 is named as a cavity. In addition, factors including the reflectivity $\rho_r$ of the reflective member 520 and the ratio H/W of the vertical separation distance H between the substrate s and the sensors 610 to the width W of the cavity 110 are named as a "cavity factor CF".

In order to reduce the deviation between the temperature of the substrate s and the actually measured temperature of the substrate s, it is necessary to consider the ratio H/W of the vertical separation distance H between the substrate s and the sensors 610 to the width W of the cavity besides the reflectivity $\rho_r$ of the reflective member. The cavity factor CF is a constant value, in other words, may be expressed as a correction factor.

In addition, there is a tendency that the greater the separation distance H between the reflective member and the substrate, the greater the value of the cavity factor CF.

Thus, in the exemplary embodiment, the cavity factor CF including the reflectivity $\rho_r$ of the reflective member 520 and the ratio H/W of the vertical separation distance H between the substrate s and the sensors 610 to the width W of the cavity 110 is applied to the reflectivity $\rho_r$ of the reflective member in Equation 5, and this is expressed as Equation 6.

$$\varepsilon_t = \frac{\varepsilon_s}{1 - CF(1 - \varepsilon_s)} \quad \text{[Equation 6]}$$

Expressing the relationship between the substrate emissivity $\varepsilon_s$ and the total emissivity $\varepsilon_t$ in a graph, the graph is as shown in FIG. 3.

Referring to FIG. 3, the greater the substrate emissivity $\varepsilon_s$, the greater the total emissivity $\varepsilon_t$. In addition, the smaller the substrate emissivity $\varepsilon_s$, the greater the slope of change of the total emissivity $\varepsilon_t$, and conversely, the greater the substrate emissivity $\varepsilon_s$, the smaller the slope of change of the total emissivity $\varepsilon_t$. Describing this in other words, when the substrate emissivity $\varepsilon_s$ is changed in a low range, the degree of change of the total emissivity $\varepsilon_t$ is relatively greater than the degree of change of the total emissivity $\varepsilon_t$ when the substrate emissivity $\varepsilon_s$ is changed in a high range. That is, in a low range of the substrate emissivity $\varepsilon_s$, the sensitivity of the total emissivity $\varepsilon_t$ according to the change in the substrate emissivity $\varepsilon_s$ is great. In particular, when the substrate emissivity $\varepsilon_s$ falls within a range of less than approximately 0.5, more specifically, less than approximately 0.3, the sensitivity of the change in the total emissivity $\varepsilon_t$ according to the change in the substrate emissivity $\varepsilon_s$ is great. A great sensitivity of the total emissivity $\varepsilon_t$ causes the deviation between the temperature calculated by Equation 1 from the temperature calculation unit 710 and the actual temperature of the substrate s. That is, when the sensitivity of the total emissivity $\varepsilon_t$ according to the change in the substrate emissivity $\varepsilon_s$ is great, this causes an increase in the error of the temperature calculated from the temperature calculation unit 710.

Hereinafter with reference to FIGS. 4 to 6, the reason for a decrease in the substrate emissivity $\varepsilon_s$ and a change in the total emissivity $\varepsilon_t$ due to the substrate emissivity $\varepsilon_s$ will be described.

In order to perform heat treatment of the substrate s, when a substrate s at room temperature is loaded into the chamber 100, the plurality of lamps 320 are operated to heat the substrate s to a process temperature. At this point, the temperature control unit 720 of the temperature calculation unit 710 controls the operation of the plurality of lamps 320 according to the temperature of the substrate s calculated by the plurality of sensors 610 and the temperature calculation unit 710. That is, according to the temperature of the substrate s calculated from the temperature calculation unit 710, whether to operate of the power, etc. of each of the plurality of lamps 320 are adjusted.

Meanwhile, when the substrate s is at room temperature, or before the substrate is heated, the substrate s is, as described in FIG. 4, in a state of being parallel to ground surface, that is, in a flat state. However, when the plurality of lamps 320 are operated to heat the substrate s to the process temperature, as described in FIG. 5, a deflection phenomenon in which the substrate s is deflected downward occurs.

In addition, as the temperature of the substrate s is raised from the room temperature to the process temperature, deflection occurs such that the center of the substrate s is gradually deflected downward, and then, when the temperature of the substrate s is raised to the process temperature and is stabilized, the center of the substrate s may deflect upward by a predetermined distance. Accordingly, the degree of deflection in the heating section in which the room-temperature substrate s is heated to the process temperature is greater than that in the stabilizing section after the temperature of the substrate s reaches the process temperature.

In addition, according to the shape, that is, the degree of deflection, of the substrate s, the substrate emissivity $\varepsilon_s$ varies, and this will be described with reference to FIGS. 4 and 5.

As shown in FIG. 4, compared to a maximum angle θ1 by which light radiated from the sensor 610, is reflected by the substrate s, and then is incident again on the sensor s when the substrate s is not deflected and is in a parallel state to the ground surface or in a flat state, a maximum angle θ2, by which light radiated from the sensor 610, is reflected by the substrate s, and then is incident again on the sensor when the substrate s is deflected as shown in FIG. 5, is great. Here, a great maximum angle means that the amount of light which is radiated from the sensor 610, is reflected by the substrate, and is incident again on the sensor 610 is increased. Accordingly, the reflectivity incident on the sensor 610 is greater when the substrate s is deflected as shown in FIG. 5 than that when the substrate s is in a flat state as shown in FIG. 4. In addition, since the reflectivity and the emissivity of the substrate are inversely proportional to each other, the greater the reflectivity, the smaller the substrate emissivity $\varepsilon_s$.

In addition, when the substrate s is deflected, the separation distances between the substrate s and the sensors 610 are different for each position. For example, when the center of the substrate s is deflected to the lowest height, the closer to the center of the substrate s, the smaller the separation distance between the substrate s and the sensors 610, and the closer to the periphery, the greater the separation distance. Accordingly, the emissivity of the substrate s may be different for each position, the closer to the center of the substrate s, the smaller the substrate emissivity $\varepsilon_s$, and the closer to the periphery, the greater the substrate emissivity $\varepsilon_s$.

Accordingly, this means that when the substrate s is heated for a substrate treatment process, the substrate emissivity $\varepsilon_s$ may vary. In addition, during the heat treatment of the substrate s, the substrate emissivity $\varepsilon_s$ may also vary in a high range, for example, in a range of approximately 0.5 or greater, but may also vary in a range of less than 0.5, more specifically, less than approximately 0.3.

The variation range of the substrate emissivity $\varepsilon_s$ may vary according to the type of substrate treatment apparatus, the type of substrate s to be heat-treated, the types and thickness of a thin film formed on the substrate s, the temperature of the substrate s, or the like.

Meanwhile, the total emissivity $\varepsilon_t$ varies according to the substrate emissivity $\varepsilon_s$ as well as the cavity factor CF (see Equation 6). According to a model for calculating the total emissivity $\varepsilon_t$ such as Equation 6, when the substrate emissivity $\varepsilon_s$ varies in a range of greater than approximately 0.3, more specifically, in a range of approximately 0.5 or greater, the sensitivity of the change in the total emissivity $\varepsilon_t$ due to the substrate emissivity $\varepsilon_s$ is small, and thus, an error generated in calculating the temperature of the substrate is not large and no problem may occur.

However, when the substrate emissivity $\varepsilon_s$ varies in a range of less than approximately 0.5, more specifically, in a range of approximately 0.3 or less, the sensitivity of the change in the total emissivity $\varepsilon_t$ due to the substrate emissivity $\varepsilon_s$ is great, and thus, an error generated in calculating the temperature of the substrate is large. Thus, when the substrate emissivity $\varepsilon_s$ is less than approximately 0.5, more specifically, is approximately 0.3 or less, it is difficult to control the substrate s to a target temperature.

However, in a heat treatment process for the substrate s, the substrate emissivity $\varepsilon_s$ may fall within a low emissivity range, that is, may have a value less than approximately 0.5 according to the type of substrate treatment apparatus, the type of substrate s to be heat-treated, the types and thickness of a thin film formed on the substrate s, the temperature of the substrate s, or the like. Therefore, even when the substrate emissivity $\varepsilon_s$ is less than approximately 0.5, more specifically, no greater than approximately 0.3, the deviation between the calculated temperature of the substrate s and the actual temperature of the substrate s should be made small.

Meanwhile, an object having "0" emissivity cannot exist practically. However, when the substrate s is deflected as in the heating section of the substrate s, the degree of deflection may be great, or the substrate emissivity $\varepsilon_s$ calculated from the reflectivity $\rho_s$ of the substrate measured by the sensors 610 by means of various apparatuses or components present on the propagation path of light inside the chamber may be decreased instantaneously to "0", that is, measured as "0".

In addition, according to Equation 6, which is a conventional model for calculating the total emissivity $\varepsilon_t$, when the substrate emissivity $\varepsilon_s$ is 0, the total emissivity $\varepsilon_t$ is calculated as 0. Thus, when the substrate emissivity $\varepsilon_s$ is calculated as 0 due to a reason such as the deflection of substrate s, the total emissivity $\varepsilon_t$ is also calculated as 0, whereby the deviation between the calculated temperature and the actual temperature of the substrate becomes large. Thus, even when the operation of the lamps 320 is controlled according to the temperature calculated from the temperature calculation unit 710, the substrate cannot be heated to the target temperature. More specifically, when the substrate emissivity $\varepsilon_s$ becomes 0 in at least any one section among the heating section in which the temperature of the substrate is heated to the process temperature and the stabilizing section in which a process is started after the temperature of the substrate reaches the process temperature, or when the substrate emissivity $\varepsilon_s$ varies within a range of less than approximately 0.5, it is difficult to adjust the temperature of the substrate to the target temperature because the deviation between the calculated temperature and the actual temperature of the substrate is large. Thus, in an exemplary embodiment, upon calculating the total emissivity $\varepsilon_t$, although the substrate emissivity $\varepsilon_s$ is calculated as 0, a "corrected total emissivity $\varepsilon_{t0}$", in which the total emissivity $\varepsilon_t$ is corrected, and is calculated by using a calculation model (Equation 7) according to the exemplary embodiment, such that while the total emissivity $\varepsilon_t$ has a predetermined non-zero emissivity value, the degree (that is, the slope) of change in the total emissivity $\varepsilon_t$ due to the change in the substrate emissivity $\varepsilon_s$ is at least within a range of less than approximately 0.5, more specifically, no greater than 0.3 is smaller than in conventional case. This corrected total emissivity $\varepsilon_{t0}$ is used for calculation of the temperature. That is, the corrected total emissivity $\varepsilon_{t0}$ according to an exemplary embodiment is a total emissivity $\varepsilon_{t0}$ in which the total emissivity $\varepsilon_t$ in Equation 6 is corrected by applying a correction value, and expressing this calculation model by an equation, the equation is the same as Equation 7 below.

$$\varepsilon_{t0} = \frac{\varepsilon_s + \varepsilon_0}{1 - CF(1 - \varepsilon_s - \varepsilon_0)} \times \frac{1 + CF\varepsilon_0}{1 + \varepsilon_0} \quad \text{[Equation 7]}$$

In Equation 7, $\varepsilon_0$ is a correction value $\varepsilon_0$, which is a constant, and is the value set prior to actual substrate treatment process in a substrate treatment apparatus. The correction value $\varepsilon_0$ is optimized and set so that the deviation between the temperature calculated from the temperature calculation unit 710 and the actual temperature of the substrate becomes minimum.

More specifically, the correction value $\varepsilon_0$ is a value which makes the total emissivity to be the predetermined total emissivity, that is, the corrected total emissivity $\varepsilon_{t0}$ even when the substrate emissivity $\varepsilon_s$ is calculated or measured as 0. In addition, the correction value $\varepsilon_0$ is a value derived such that when the substrate emissivity $\varepsilon_s$ varies at least within a range of less than approximately 0.5, more specifically, no greater than 0.3, the sensitivity of the corrected total emissivity $\varepsilon_{t0}$ according to a change in the substrate emissivity $\varepsilon_s$ is smaller than the conventional sensitivity of the total emissivity $\varepsilon_t$. That is, with the correction value $\varepsilon_0$, the slope of the corrected total emissivity $\varepsilon_{t0}$ according to the substrate emissivity $\varepsilon_s$ within a range of at least less than approximately 0.5, more specifically, no greater than 0.3 is smaller than the slope of the conventional total emissivity $\varepsilon_t$.

Referring to FIG. 7, comparing a graph according to the corrected total emissivity $\varepsilon_{t0}$ according to an exemplary embodiment and the graph of the conventional total emissivity $\varepsilon_t$, it can be understood that the value of total corrected emissivity $\varepsilon_{t0}$ according to the exemplary embodiment is greater and has a lower slope at least within a range of less than approximately 0.5, more specifically, no greater than 0.3. Accordingly, when the corrected total emissivity $\varepsilon_{t0}$ is calculated by applying Equation 7 according to an exemplary embodiment, and when the substrate emissivity $\varepsilon_s$ varies at least within a range of less than approximately 0.5, the degree of change in, that is, the sensitivity of, the corrected total emissivity according to the change in the substrate emissivity $\varepsilon_s$ can be reduced. Therefore, even when the substrate emissivity $\varepsilon_s$ varies within a range of less than approximately 0.5 during the substrate treatment process, the deviation between the temperature calculated from the temperature calculation unit and the actual temperature of the substrate can be reduced compared to that in conventional art.

The corrected total emissivity $\varepsilon_{t0}$ described above is applied, in the temperature calculation unit 710, to Equation 1, which is the temperature calculation equation, to calculate a temperature. That is, in the temperature calculation unit, the wavelength of light radiated from the sensors 610 is applied in advance to $\lambda$ in Equation 1, a constant of approximately $3.7419*10^{-16}$ is applied to $C_1$, and a constant of approximately 14.387 to $C_2$. In addition, the value measured from the sensors 610 is applied to the total radiant energy Et of the substrate, and the value calculated from the above Equation 7 is applied to the corrected total emissivity $\varepsilon_{t0}$, whereby the temperature of the substrate may be calculated.

As such the temperature of the substrate s is calculated from the temperature calculation unit 710, whereby the deviation between the calculated temperature of the substrate and the actual temperature of the substrate s may be reduced than in the conventional art. Accordingly, when the substrate s is heated to the process temperature or when the temperature raised to the process temperature is stabilized, it becomes easy to control the plurality of lamps 320 so that the temperature control unit 720 reaches the target temperature, and thus, the reliability of the substrate treatment process is improved.

The correction unit 800 corrects at least one of the correction value $\varepsilon_0$ and the cavity factor CF before or after the substrate treatment process to thereby allow the deviation between the temperature, calculated in real time during the actual substrate treatment process, of the substrate s and the actual temperature of the substrate s to be small.

The correction unit 800 includes: a correction unit 810 which derives the optimized correction value $\varepsilon_0$ and the cavity factor CF; and a monitoring unit 820 which compares the cavity factor CF of the correction unit 810 with a reference value to monitor the state of the reflective member 520.

The correction unit 810 optimizes and derives the correction value $\varepsilon_0$ of the corrected total emissivity $\varepsilon_{t0}$ and the cavity factor CF which are used in Equation 1 and Equation 7 which are models for calculating the temperature of the substrate s in real time during the actual substrate treatment process. Here, the optimization means that the correction value $\varepsilon_0$ and the value of the cavity CF are set for the purpose of making the deviation between the temperature, calculated in real time during the actual substrate treatment process, of the substrate and the actual temperature of the substrate to be minimized or equal to each other.

Hereinafter, in order to distinguish the temperature $T_s$ of the substrate calculated from the temperature calculation unit during the substrate treatment process, and the temperature of the substrate calculated from the correction unit in order to derive, as optimized values, the correction value $\varepsilon_0$, and the cavity factor, the temperature of the substrate calculated from the correction unit in order to derive, as optimized values, the correction value $\varepsilon_0$ and the cavity factor is named as a "corrected calculated temperature $T_d$".

The corrected calculated temperature $T_d$ can be expressed as the right side of Equation 1, and this is the same as Equation 8 below.

$$T_c = \frac{C_2}{\lambda \cdot \ln\left\{\frac{\varepsilon_{t0}}{\lambda^5}\frac{C_1}{E_t}\right\}} \quad \text{[Equation 8]}$$

In order to derive the correction value $\varepsilon_0$ and the cavity factor CF, a substrate is prepared and then heated. In addition, the temperature of the substrate heated to a predetermined temperature is measured through a measuring means such as a thermocouple other than a calculation method, and this temperature is named an actual temperature ($T_{real}$) of the substrate.

In addition, the correction unit calculates and derives the correction value $\varepsilon_0$ and the cavity factor CF so that the corrected calculated temperature $T_d$ becomes the actual temperature $T_{real}$ of the substrate or so that the deviation between the corrected calculated temperature $T_d$ and the actual temperature $T_{real}$ of the substrate is minimized. Expressing this by an equation, the equation is the same as Equation 9 below.

$$T_{real} = T_c - 273.15 \quad \text{[Equation 9]}$$

In Equation 9, $T_{real}$ is a Celsius temperature, and $T_c$ is the corrected calculated temperature (° C.) calculated by Equation 8 as described above and is a value of absolute temperature (K).

In an exemplary embodiment, as shown in Equation 9, a Celsius temperature ($T_s$−273.15) in which 273.15° C. is subtracted from the corrected calculated temperature $T_c$ is the same as the temperature measured by a temperature measuring means. An optimized correction value $\varepsilon_0$ and cavity factor CF are derived by using the equation ($T_{real} = T_s - 273.15$).

When Equation 1 is applied to the corrected calculated temperature $T_c$ in Equation 9 for deriving the cavity factor CF and the correction value $\varepsilon_0$, Equation 10 is derived.

$$T_{real} = \frac{C_2}{\lambda \cdot \ln\left\{\frac{\varepsilon_{t0} C_1}{\lambda^5 E_t}\right\}} - 273.15 = \quad \text{[Equation 10]}$$

$$\frac{1}{\frac{\lambda}{C_2}\ln \varepsilon_{t0} + \frac{\lambda}{C_2}\ln\left(\frac{C_1}{\lambda^5 E_t}\right)} - 273.15$$

Equation 7 is applied to the corrected total emissivity $\varepsilon_{t0}$ in Equation 10, and thus, optimized correction value $\varepsilon_0$ and the cavity factor CF are derived.

In the exemplary embodiment, as described above, the optimized correction value $\varepsilon_0$ and cavity factor CF are derived by applying Equation 8, as it is, to the corrected calculated temperature $T_c$ in Equation 9.

However, embodiments are not limited thereto, and the optimized correction value and cavity factor can be derived by changing the total radiant energy $E_t$ in Equation 8 into a radiation temperature $T_e$ and applying the resultant to the corrected calculated temperature $T_c$.

The total radiant energy $E_t$ in Equation 8 may be expressed by Equation 11 as a radiation temperature $T_e$.

$$T_e = \frac{C_2}{\lambda \cdot \ln\left(\frac{C_1}{\lambda^5 E_t}\right)} - 273.15 \quad \text{[Equation 11]}$$

In addition, when Equation 11 is applied to the radiant energy $E_t$ in Equation 8, the corrected calculated temperature $T_c$ is the same as Equation 12 below.

$$T_c = \frac{1}{(T_e + 273.15)^{-1} + \frac{\lambda}{C_2} \ln \varepsilon_{t0}} \quad \text{[Equation 12]}$$

In addition, when the corrected calculated temperature $T_c$ in Equation 12 is applied to the corrected calculated temperature $T_c$ in Equation 9, the equation is the same as Equation 13 below.

$$T_{real} = \frac{1}{(T_e + 273.15)^{-1} + \frac{\lambda}{C_2} \ln \varepsilon_{t0}} - 273.15 = \quad \text{[Equation 13]}$$

$$\frac{1}{(T_e + 273.15)^{-1} + \frac{\lambda}{C_2} \ln\left(\frac{\varepsilon_s + \varepsilon_0}{1 - CF(1 - \varepsilon_s - \varepsilon_0)} \times \frac{1 + CF\varepsilon_0}{1 + \varepsilon_0}\right)} - 273.15$$

In an exemplary embodiment, the optimized correction value $\varepsilon_0$ and the cavity factor CF are derived in the correction unit 810 by using Equation 10 or Equation 13. At this point, since the number of factors or unknowns to be derived is two, that is, the correction value $\varepsilon_0$ and cavity factor CF, at least two or more equations are formed by using Equation 10 or Equation 12, and the optimized correction value $\varepsilon_0$ and the cavity factor CF are calculated by calculating the equations as simultaneous equations. Here, when a plurality of equations are formed by using Equation 10 or Equation 13, the plurality of equations are formed by using two substrates having emissivity different from each other.

In addition, in making two equations by applying Equation 10 or Equation 13, the actual temperature of the substrate is applied to $T_{real}$, 14.387 is applied to C2, and the wavelength of the light radiated from the sensors 610, for example, approximately 0.000965 nm is applied to $\lambda$. The substrate emissivity $\varepsilon_s$ is a value measured by the sensors 610.

Each of the plurality of equations formed as such has two unknowns, that is, the correction value $\varepsilon_0$ and the cavity factor CF. When these two equations are associated and calculated, the optimized correction value $\varepsilon_0$ and the cavity factor CF may be derived.

Hereinafter, the method for deriving optimized correction value $\varepsilon_0$ and cavity CF will be described with specific examples. Here, a method using Equation 13 will be described as an example.

The process of deriving optimized correction value $\varepsilon_0$ and cavity factor CF includes: heat treating and heating a sub-strate under actual conditions of substrate treatment process; obtaining the emissivity $\varepsilon_s$ of the heated substrate, the radiation temperature Te, the corrected total emissivity $\varepsilon_{t0}$, and the temperature $T_s$ of the substrate; and deriving the optimized cavity factor CF and the correction value $\varepsilon_0$ using the above-described values.

The obtaining the emissivity $\varepsilon_s$ of the heated substrate, the radiation temperature $T_e$, the corrected total emissivity $\varepsilon_{t0}$, and the temperature $T_s$ of the substrate is obtained in calculating the corrected calculated temperature $T_c$. That is, the radiation temperature $T_e$ calculated from Equation 11 is applied to $T_e$ in Equation 12, a constant of approximately 14.387 is applied to a constant of approximately 0.000965 is applied to $\lambda$, and Equation 7 is applied to $\varepsilon_{t0}$. Here, the emissivity $\varepsilon_s$ of the substrate measured by the sensors is applied to $\varepsilon_s$ in Equation 7, and each of the cavity factor CF and the correction value $\varepsilon_0$ are set to 0.

These processes are performed by using a plurality of substrates having emissivities different from each other, and the actual temperatures $T_{real}$ of the substrates are made different from each other.

For example, a first substrate having an emissivity $\varepsilon_s$ of approximately 0.615 is heated so that the actual temperature $T_{real}$ thereof reaches approximately 1050° C. Here, the correction unit calculates the substrate emissivity $\varepsilon_s$, the total radiant energy $E_t$, and the radiation temperature $T_e$ from the heated substrate, and this is as shown in Table 1. In addition, the correction unit calculates the corrected calculated temperature $T_c$ by setting each of the cavity factor CF and the correction value $\varepsilon_0$ to 0, the calculated value is an absolute temperature, and 273.15 is added to or subtracted from this to calculate the corrected calculated temperature $T_c$ in a Celsius temperature.

TABLE 1

| Division | | Actual temperature of substrate ($T_{real}$) [° C.] | Radiation temperature (Te) [° C.] | Emissivity of substrrate ($\varepsilon_s$) | Cavity factor (CF) | Correction value ($\varepsilon_0$) | Corrected total emissivity ($\varepsilon_{t0}$) | Corrected calculated temperature (Tc) [° C.] | Temperature deviation (° C.) [° C.] |
|---|---|---|---|---|---|---|---|---|---|
| Data acquisition | First substrate | 1050 | 1041.7 | 0.615 | 0 | 0 | 0.615 | 1100.6 | 50.6 |
| | Second substrate | 950 | 922.8 | 0.200 | 0 | 0 | 0.200 | 1100.1 | 150.1 |

Referring to Table 1, when the actual temperature $T_{real}$ of the first substrate which has the emissivity $\varepsilon_s$ of approximately 0.615 is approximately 1050° C., the calculated radiation temperature is approximately 1041.7° C., and the corrected total emissivity $\varepsilon_{t0}$ is approximately 0.615. In addition, applying these values to Equation 12, the absolute temperature is calculated, and when 273.15° C. is subtracted from this temperature, the corrected calculated temperature becomes approximately 1100.6° C. This is a value by which a deviation of approximately 50.6° C. occurs with respect to the actual temperature ($T_{real}$) of the substrate.

In another example, a second substrate having an emissivity $\varepsilon_s$ of approximately 0.200 is heated so that the actual temperature $T_{real}$ thereof reaches approximately 950° C. In addition, the radiation temperature $T_e$ is calculated through Equation 11, and by reflecting this in Equation 12, the corrected calculated temperature $T_c$ is calculated.

Referring to Table 1, when the actual temperature $T_{real}$ of the second substrate which has the emissivity $\varepsilon_s$ of approximately 0.200 is approximately 1050° C., the calculated radiation temperature is approximately 922.8° C., and the corrected total emissivity $\varepsilon_{t0}$ is approximately 0.200. In addition, when these values are applied to Equation 12, the corrected calculated temperature $T_e$ is calculated, and when 273.15° C. is subtracted from this temperature, the calculated corrected calculated temperature $T_e$ is approximately 1100.1° C. This is a value by which a deviation of approximately 150.1° C. occurs with respect to the actual temperature ($T_{real}$) of approximately 950° C. of the substrate.

[Second mathematical equation]
$$950 = \frac{1}{(922.8+273.15)^{-1} + \frac{0.000965}{14.387} \ln\left(\frac{0.200+\varepsilon_0}{1-CF(1-0.200-\varepsilon_0)} \times \frac{1+CF\varepsilon_0}{1+\varepsilon_0}\right)} - 273.15$$

TABLE 2

| Division | | Actual temperature of substrate ($T_{real}$) [° C.] | Radiation temperature ($T_e$) [° C.] | Emissivity of substrate ($\varepsilon_s$) | Cavity factor (CF) | Correction value ($\varepsilon_0$) | Corrected total Emissivity ($\varepsilon_{t0}$) | Corrected calculated temperature ($T_c$) [° C.] | Temperature deviation (° C.) [° C.] |
|---|---|---|---|---|---|---|---|---|---|
| Derivation | First substrate | 1050 | 1041.7 | 0.615 | 0.748 | 0.3125 | 0.922 | 1050 | 0 |
| | Second substrate | 50 | 22.8 | 0.200 | 0.748 | 0.3125 | 0.758 | 950 | 0 |

In deriving the optimized cavity factor CF and the correction value $\varepsilon_0$, the optimized cavity factor CF and the correction value $\varepsilon_0$ are derived by applying the obtained value and the actual temperature $T_{real}$ of the substrate to Equation 13.

First, by applying the above-mentioned obtained values from the first and second substrates, Equations (first and second equations) are derived with respect to the first and second substrates.

First, in deriving an equation (the first equation) with respect to the first substrate, approximately 1050° C. is applied to actual temperature $T_{real}$ in Equation 12, approximately 1041.7° C. is applied to the radiation temperature $T_e$, approximately 14.987 is applied to $C_2$, approximately 0.000965 is applied to the wavelength λ, and approximately 0.615 is applied to the substrate emissivity $\varepsilon_s$, and the cavity factor CF and the correction value $\varepsilon_0$ are set to unknowns, whereby the first equation is formed.

[First mathematical equation]
$$1050 = \frac{1}{(1047.7+27.315)^{-1} + \frac{0.000965}{14.387} \ln\left(\frac{0.615+\varepsilon_0}{1-CF(1-0.615-\varepsilon_0)} \times \frac{1+CF\varepsilon_0}{1+\varepsilon_0}\right)} - 273.15$$

In deriving an equation (the second equation) with respect to the second substrate, approximately 950° C. is applied to actual temperature $T_{real}$ in Equation 12, approximately 922.8° C. is applied to the radiation temperature $T_e$, approximately 14.987 is applied to $C_2$, approximately 0.000965 is applied to the wavelength λ, and approximately 0.200 is applied to the substrate emissivity $\varepsilon_s$, and the cavity factor CF and the correction value $\varepsilon_0$ are set to unknowns, whereby the second equation is formed.

The correction unit 810 performs calculation by associating the first equation and the second equation, and thus, the correction value $\varepsilon_0$ and the cavity factor CF are calculated. In the above example, the derived optimized cavity factor is approximately 0.748 and the correction value $\varepsilon_0$ is approximately 0.3125.

The optimized cavity factor CF and the correction value $\varepsilon_0$ is applied to Equation 7 when the temperature of the substrate is calculated in the temperature calculation unit 710 during the actual substrate treatment process, and this is applied to Equation 1 to calculate the temperature.

Accordingly, during the process of performing heat treatment on a substrate, the deviation between the temperature calculated from the temperature calculation unit 710 and the actual temperature of the substrate is smaller than in conventional arts or is minimized, and thus, heating the substrate to a target temperature becomes easy. Accordingly, there is an effect in that the reliability of the substrate treatment process is improved, and the defective products are reduced.

The process of optimizing the cavity factor CF and the correction value $\varepsilon_0$ as described above may be performed after performing a plurality of times of processes, or may also be performed every time a process is once completed before the next process is performed.

In the monitoring unit 820, the cavity factor CF derived from the correction unit 810 is compared to a reference value, and according to the compared results, whether to replace or repair the reflective member 520 is determined and displayed. The cavity factor regarding the reflectivity $\rho_r$ of the reflective member 520 and the ratio of the separation distance H between the substrate s and the sensors 610 to the width of the cavity. When the cavity factor CF is small, that is, smaller than a reference value, it is determined that there is a problem in the reflectivity of the reflective member 520, and work for replacing or repairing the reflective member 520 is performed.

As such, the monitoring unit 820 monitors the cavity factor CF, so that there is an effect in that the replacement or repair of the reflective member 520 becomes easy, and the efficiency of management of the reflective member 520, which is a consumable part, is improved.

According to an exemplary embodiment, the deviation between the calculated temperature of a substrate and the actual temperature of the substrate can be reduced compared to that in related arts. Accordingly, while heating the substrate to a process temperature or stabilizing the temperature raised to the process temperature, reliability of the calculated temperature for controlling the substrate at target temperature for each stage is improved. Thus, the reliability of a substrate treatment process is improved and defects can be reduced.

What is claimed is:

1. A substrate treatment method comprising:
   heating a substrate, for a substrate treatment process, so that a temperature of the substrate reaches a target temperature;
   calculating a temperature of the substrate using a sensor located facing the substrate while heating the substrate; and
   controlling an operation of a heating part configured to heat the substrate according to the temperature calculated from calculating the temperature, wherein calculating the temperature comprises:
   measuring a total radiant energy ($E_r$) radiated from the substrate using the sensor;
   calculating a corrected total emissivity ($\varepsilon_{t0}$) by applying a correction value ($\varepsilon_0$) for correcting a total emissivity ($\varepsilon_t$) which is the emissivity of the radiant energy ($E_t$); and
   calculating the temperature ($T_s$) of the substrate using the total radiant energy ($E_r$) and the corrected total emissivity ($\varepsilon_{t0}$).

2. The substrate treatment method of claim 1, wherein the temperature is calculated by using Equation 1 below in calculating the temperature $T_s$ of the substrate using the total radiant energy ($E_r$) and the corrected total emissivity ($\varepsilon_{t0}$):

$$T_s = \frac{C_2}{\lambda \cdot \ln\left\{\frac{\varepsilon_{t0} \, C_1}{\lambda^5 E_t}\right\}} \quad \text{[Equation 1]}$$

in Equation 1 wherein, $\lambda$ is a wavelength of light radiated from the sensor for the light,
$C_1$ is approximately $3.7419 \times 10^{-16}$, and
$C_2$ is a constant of approximately 14.387.

3. The substrate treatment method of claim 2, wherein:
   a reflective member is installed at a position facing the substrate;
   the sensor is installed to pass through the reflective member in a vertical direction;
   a free space defined by the substrate and the reflective member is called a cavity;
   the corrected total emissivity ($\varepsilon_{t0}$) is calculated by using an emissivity ($\varepsilon_s$) of the substrate and a cavity factor (CF); and
   the cavity factor (CF) comprises a reflectivity ($p_r$) of the reflective member and a ratio (H/W) of a separation distance (H) between the substrate and the sensor with respect to a width (W) of a separation space between the substrate and the reflective member.

4. The substrate treatment method of claim 3, wherein the corrected total emissivity ($\varepsilon_{t0}$) is calculated by using Equation 7 below, which includes the correction value ($\varepsilon_0$), the emissivity ($\varepsilon_s$) of the substrate, and the cavity factor (CF).

$$\varepsilon_{t0} = \frac{\varepsilon_s + \varepsilon_0}{1 - CF(1 - \varepsilon_s - \varepsilon_0)} \times \frac{1 + CF\varepsilon_0}{1 + \varepsilon_0}. \quad \text{[Equation 7]}$$

5. The substrate treatment method of claim 4, comprising deriving and setting the correction value ($\varepsilon_0$) and the cavity factor (CF) before the substrate treatment process, wherein
   the temperature ($T_s$) of the substrate is calculated by applying the derived correction value ($\varepsilon_0$) and the derived cavity factor (CF) to above Equation 7.

6. The substrate treatment method of claim 5, comprising:
   comparing the derived cavity factor (CF) with a reference value after the deriving the correction value ($\varepsilon_0$) and the cavity factor (CF); and
   replacing or repairing the reflective member when the cavity factor (CF) is less than the reference value.

7. The substrate treatment method of claim 6, wherein the deriving the correction value ($\varepsilon_0$) and the cavity factor (CF) comprises:
   (1) preparing a first substrate and a second substrate having a different emissivity from the first substrate;
   (2) heating the first substrate and the second substrate and measuring an actual temperature ($T_{real}$) of each of the first substrate and the second substrate;
   (3) calculating, using Equation 11 below, a radiation temperature ($T_e$) for each of the first substrate and the second substrate by applying a total radiant energy ($E_t$) measured from each of the first substrate and the second substrate;
   (4) calculating, using Equation 12 below, a corrected calculated temperature ($T_c$) for each of the first substrate and the second substrate by applying the radiation temperature ($T_e$) for each of the first substrate and the second substrate;
   (5) determining any deviation between the actual temperature ($T_{real}$) of the first substrate and the corrected calculated temperature ($T_c$) of the first substrate, and determining any deviation between the actual temperature ($T_{real}$) of the second substrate and the corrected calculated temperature ($T_c$) of the second substrate; and
   (6) calculating, using Equation 13 below, the correction value ($\varepsilon_0$) and the cavity factor (CF) for any deviations determined as stated above;
   (7) wherein the calculating the correction value ($\varepsilon_0$) and the cavity factor (CF) comprises:
      (7-1) preparing a first equation configured to set the cavity factor (CF) and the correction value ($\varepsilon_0$) in Equation 13 as unknowns, and applying the actual temperature ($T_{real}$) and the radiation temperature ($T_e$) of the first substrate to Equation 13;
      (7-2) preparing a second equation configured to set the cavity factor (CF) and the correction value ($\varepsilon_0$) in Equation 13 as unknowns, and applying the actual temperature ($T_{real}$) and the radiation temperature ($T_e$) of the second substrate to Equation 13; and
      (7-3) deriving the correction value ($\varepsilon_0$) and the cavity factor (CF) by associatively calculating the first and second equations;

$$T_e = \frac{C_2}{\lambda \cdot \ln\left\{\frac{C_1}{\lambda^5 E_t}\right\}} - 273.15 \quad \text{[Equation 11]}$$

-continued $$T_c = \frac{1}{(T_e + 273.15)^{-1} + \frac{\lambda}{C_2}\ln\varepsilon_{t0}}$$ [Equation 12]

$$T_{real} = \frac{1}{(T_e + 273.15)^{-1} + \frac{\lambda}{C_2}\ln\varepsilon_{t0}} - 273.15 =$$ [Equation 13]

$$\frac{1}{(T_e + 273.15)^{-1} + \frac{\lambda}{C_2}\ln\left(\frac{\varepsilon_s + \varepsilon_0}{1 - CF(1 - \varepsilon_s - \varepsilon_0)} \times \frac{1 + CF\varepsilon_0}{1 + \varepsilon_0}\right)} - 273.15$$

wherein $T_e$ is radiation temperature,
wherein $\lambda$ is a wavelength of light radiated from the sensor for the light,
wherein $C_1$ is approximately $3.7419*10^{-16}$,
wherein $C_2$ is a constant of approximately 14.387, and
wherein $\varepsilon_s$ is the emissivity of the substrate.

8. A substrate treatment apparatus comprising:
a substrate support part configured to support a substrate on an upper portion thereof;
a base located to face the substrate support part under the substrate support part and provided with a reflective member installed on a surface thereof facing the substrate support part;
a heating part located over the substrate support part to face the substrate support part and configured to heat the substrate;
a sensor inserted and installed in the base to face the substrate mounted on the substrate support part, and configured to measure a total radiant energy ($E_t$) and reflectivity ($p_s$) which are radiated from the substrate; and
a temperature control unit configured to calculate a temperature ($T_s$) of the substrate using the total radiant energy ($E_t$) and reflectivity ($p_s$), which are measured by the sensor and control an operation of the heating part according to the calculated temperature ($T_s$) of the substrate;
the temperature control unit calculates the temperature ($T_s$) of the substrate using a corrected total emissivity ($\varepsilon_{t0}$) calculated by applying a correction value ($\varepsilon_0$) to a total emissivity ($\varepsilon_t$) which is the emissivity of the total radiant energy ($E_r$).

9. The substrate treatment apparatus of claim 8, wherein the temperature control unit calculates the temperature ($T_s$) of the substrate using Equation 1 including the total radiant energy ($E_t$) and the corrected total emissivity ($\varepsilon_{t0}$):

$$T_s = \frac{C_2}{\lambda \cdot \ln\left\{\frac{\varepsilon_{t0}}{\lambda^5 E_t}\right\}}$$ [Equation 1]

wherein in Equation 1, $\lambda$ is a wavelength of light radiated from the sensor for the light,
$C_1$ is approximately $3.7419*10^{-16}$, and
$C_2$ is a constant of approximately 14.387.

10. The substrate treatment apparatus of claim 9, wherein the temperature control unit calculates the corrected total emissivity ($\varepsilon_{t0}$) using the emissivity ($\varepsilon_s$) of the substrate and a cavity factor (CF), and
the cavity factor (CF) comprises
a reflectivity ($p_r$) of the reflective member and
a ratio (H/W) of a separation distance (H) between the substrate and the sensor with respect to a width (W) of a cavity which is a separation space between the substrate and the reflective member.

11. The substrate treatment apparatus of claim 10, wherein the temperature control unit calculates the corrected total emissivity ($\varepsilon_{t0}$) using Equation 7 including the correction value ($\varepsilon_0$), the emissivity ($\varepsilon_s$) of the substrate, and the cavity factor (CF).

$$\varepsilon_{t0} = \frac{\varepsilon_s + \varepsilon_0}{1 - CF(1 - \varepsilon_s - \varepsilon_0)} \times \frac{1 + CF\varepsilon_0}{1 + \varepsilon_0}.$$ [Equation 7]

12. The substrate treatment apparatus of claim 11, comprising a correction unit configured to derive the correction value ($\varepsilon_0$) and the cavity factor (CF) for optimization of the correction value ($\varepsilon_0$) and the cavity factor (CF) before and after a substrate treatment process.

13. The substrate treatment apparatus of claim 12, comprising a monitoring unit configured to compare the cavity factor (CF) derived from the correction unit with a reference value, and determine and display whether to replace or repair the reflective member according to a comparison result.

* * * * *